(12) United States Patent
Funcheon et al.

(10) Patent No.: US 9,170,293 B2
(45) Date of Patent: Oct. 27, 2015

(54) POWER LINE INDICATOR ACCESSORY FOR FUSIBLE CIRCUIT PROTECTION DEVICE ARRAY

(75) Inventors: Austin J. Funcheon, Ballwin, MO (US); Patrick Thomas McKinney, Ballwin, MO (US); Daniel Dunlap, Meredith, NH (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 335 days.

(21) Appl. No.: 13/491,132

(22) Filed: Jun. 7, 2012

(65) Prior Publication Data

US 2013/0329332 A1 Dec. 12, 2013

(51) Int. Cl.
*H02H 5/04* (2006.01)
*G01R 31/02* (2006.01)
*H01H 23/02* (2006.01)
*H01H 23/10* (2006.01)
*H01H 85/045* (2006.01)
*H01H 85/32* (2006.01)

(52) U.S. Cl.
CPC ............ *G01R 31/026* (2013.01); *H01H 23/025* (2013.01); *H01H 23/10* (2013.01); *H02H 5/048* (2013.01); *H01H 85/0452* (2013.01); *H01H 85/32* (2013.01)

(58) Field of Classification Search
CPC ..... G01R 31/026; H02H 5/048; H02H 23/10; H02H 23/025; H02H 85/32; H02H 85/0452
USPC ........................ 337/79, 376; 361/104; 324/539
See application file for complete search history.

(56) References Cited

U.S. PATENT DOCUMENTS

| | | | | |
|---|---|---|---|---|
| 3,831,089 A | * | 8/1974 | Pearce | 324/122 |
| 4,281,322 A | * | 7/1981 | Nasu et al. | 340/638 |
| 4,394,602 A | * | 7/1983 | Apgar et al. | 315/71 |
| 4,556,874 A | | 12/1985 | Becker | |
| 4,661,807 A | * | 4/1987 | Panaro | 340/638 |
| 5,343,192 A | * | 8/1994 | Yenisey | 340/639 |
| 5,347,418 A | * | 9/1994 | Ando et al. | 361/104 |
| 5,355,274 A | * | 10/1994 | Marach et al. | 361/104 |
| RE36,317 E | * | 9/1999 | Arratia | 337/206 |
| 6,633,475 B2 | * | 10/2003 | Thiele | 361/104 |
| 6,717,505 B1 | * | 4/2004 | Bruchmann | 337/194 |
| 7,342,763 B2 | * | 3/2008 | Mladenik et al. | 361/119 |
| 7,375,937 B2 | * | 5/2008 | Bax et al. | 361/42 |
| 7,474,194 B2 | * | 1/2009 | Darr et al. | 337/72 |
| 7,561,017 B2 | * | 7/2009 | Darr et al. | 337/79 |
| 7,719,257 B2 | * | 5/2010 | Robarge et al. | 324/117 R |
| 7,855,630 B2 | * | 12/2010 | Darr | 337/206 |
| 2005/0018371 A1 | * | 1/2005 | Mladenik et al. | 361/78 |
| 2005/0024218 A1 | * | 2/2005 | Cuk | 340/638 |
| 2008/0079437 A1 | * | 4/2008 | Robarge et al. | 324/522 |
| 2008/0204034 A1 | * | 8/2008 | Blades | 324/522 |
| 2009/0086396 A1 | * | 4/2009 | Bax et al. | 361/93.6 |
| 2012/0056708 A1 | | 3/2012 | Ventura et al. | |

* cited by examiner

*Primary Examiner* — Anatoly Vortman
(74) *Attorney, Agent, or Firm* — Armstrong Teasdale LLP

(57) ABSTRACT

A power line indicator accessory configured to simultaneously determine an operating state of a plurality of conductors establishing a circuit connection to a plurality of circuit protection devices such as a fusible switch disconnect devices or modular fuse holders arranged side-by-side in an array. The accessory includes an onboard power supply and a thin, elongated body facilitating its use in tight spaces.

40 Claims, 6 Drawing Sheets

POWER LINE INDICATOR ACCESSORY FOR FUSIBLE CIRCUIT PROTECTION DEVICE ARRAY

BACKGROUND OF THE INVENTION

The field of the invention relates generally to fusible circuit protection devices, and more specifically, to an accessory for indicating the status of power lines connecting to an array of fusible switching disconnect devices.

Fuses are widely used as overcurrent protection devices to prevent costly damage to electrical circuits. Fuse terminals typically form an electrical connection between an electrical power source and an electrical component or a combination of components arranged in an electrical circuit. One or more fusible links or elements, or a fuse element assembly, is connected between the fuse terminals, so that when electrical current through the fuse exceeds a predetermined limit, the fusible elements melt and opens one or more circuits through the fuse to prevent electrical component damage.

A variety of fusible disconnect devices are known in the art wherein fused output power may be selectively switched from a power supply. Existing fusible disconnect switch devices, however, have not completely met the needs of those in the art.

DETAILED DESCRIPTION OF THE INVENTION

Fusible circuit protection devices are sometimes utilized in an array on electrical panels and the like in an electrical power distribution system. Each fusible circuit protection device include a single fuse or multiple fuses depending on the application, and each fusible circuit protection device protects load side circuitry from overcurrent conditions and the like that may potentially damage load side systems and components. As the number of fusible circuit protection devices increases at any given location, certain difficulties can be presented from an installation and maintenance perspective.

Specifically, a large number of circuits are established through the fusible circuit protection devices in certain applications, and it can be time consuming to verify that completions to line side circuits have been properly established. Conventionally, the line side connections have been checked and verified one at a time to ensure that power is being received by the fusible circuit protection devices. As the number of line side connections increases, this can become a tedious exercise, and is subject to human error. One may easily skip some of the connections without realizing it, or inadvertently re-check connections that were already confirmed. Aside from labor costs to verify the connections, suboptimal operation of power systems may result if one or more of the fusible circuit protection devices is not properly connected to line side circuitry, rendering connected circuitry useless in the power system. In certain systems having large numbers of fusible circuit protection devices, such conditions may exist indefinitely without being detected.

Figure 1:
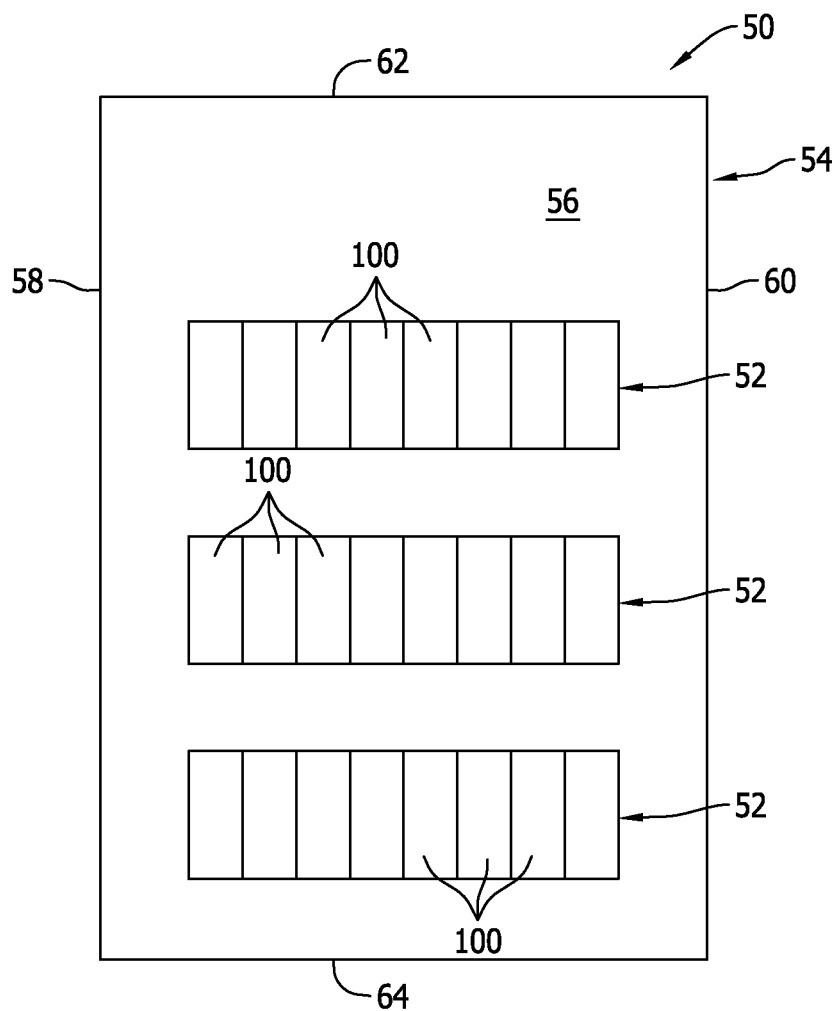
FIG. 1 is a front view of an array of fusible circuit protection devices.

For example, FIG. 1 illustrates an array 50 of fusible circuit protection devices 100. The fusible circuit protection devices 100 are arranged in a plurality of rows 52 wherein the devices 100 are arranged side-by-side with eight such devices 100 in each row. In the example shown, three rows 52 are depicted for a total of twenty-four devices 100 in the array. However, even greater numbers of rows may be provided depending on the power system being protected. Also, it is understood that the devices 100 may be arranged in columns instead or rows, or in columns and rows as desired.

The rows 52 of devices 100 may further be provided in an enclosure 54 including a base wall 56, lateral side walls 58 and 60 depending from the base wall 56, end walls 62 and 64 depending from the base wall 56 and interconnecting the side walls 58 and 60, and an optional lid. The rows 52 of devices 100 may be mounted to a DIN Rail (not shown in FIG. 1) extending on the base wall 54. The enclosure is sometimes referred to as a combiner box wherein a relatively large number of electrical connections, both line side and load side in the power system, are established. The combiner box may be mounted vertically or horizontally at any location necessary or desired.

Line side and load electrical connections are made to each of the fusible circuit protection devices 100 in the array 50, such that in the example shown there are forty eight electrical connections to be established (i.e., a line side connection and a load side connection to each of the twenty four devices 100). When installing or troubleshooting the array 50, the power line connections to the fusible circuit protection devices 100 need to be confirmed. That is, it is desirable to confirm that the circuit protection devices 100 are receiving current from the line side circuitry at the time of installation, and also thereafter.

In normal operation, current flows from the line side through each device 100 and the fuse therein to the load side protected circuitry. If certain ones of the fusible circuit protection devices 100 are receiving electrical power from the line side but not supplying electrical power to the load side, load side circuitry associated with those devices 100 is electrically isolated from the line side and corrective action must be taken to fully restore the affected load side circuitry.

Devices 100 that are receiving input electrical power from the line side, but not outputting power to the load side may be attributable to a problem with the fuse in the affected devices 100. The fuse may have opened as it was designed to protect the load side circuitry from potentially damaging current conditions, may not have been properly installed to complete the electrical connection through the device 100, or may perhaps be simply defective. The corrective action to take in such scenarios would be to replace the fuse if it has opened or is defective, or to properly install it to complete the connection through the device 100.

It is not always the case, however, that a lack of power output to the load side circuitry from certain of the devices 100 can be attributable to a fuse in those devices 100. For example, an open circuit may be created in the power line circuitry upstream from the array 50 and as a result electrical power is no longer being supplied to one or more of the devices 100. Open circuits in the line side may be the result of operation of other circuit protection devices upstream from the combiner box 54, the operation of switches in the line side circuitry, or may have other causes. Issues upstream from the affected fusible circuit protection devices 100 in the power distribution system may, however, easily be mistaken for fuse problems, and fuses may consequently be replaced only to find that the load side circuitry cannot be restored until the issues upstream in the power distribution system are resolved.

Of course, it is also possible that what appears to be a problem with the fuse or power line circuitry is actually a poor power line connection to the device 100. That is, power is being supplied from the line side, but the power line connection to one or more of the devices 100 is insufficient to transmit power to the device 100. This condition may also be easily mistaken for a fuse problem, and fuses may consequently be replaced only to find that the load side circuitry cannot be restored until the line side connections are properly established.

Thus, when attending to the array 50 of fusible circuit protection devices 100, a daunting number of possibilities may be present regarding corrective actions to take to establish and/or to restore full operation of the power circuitry. Each of the possibilities above may simultaneously exist such that different electrical loads are electrically isolated from the line side circuitry for different reasons, and different corrections actions must be taken to establish or restore those loads. Efficiently diagnosing the problems and attending to them can be as much of an art as a science.

Likewise, when installing the array 50 of fusible circuit protection devices 100, there are a number of opportunities to establish incomplete electrical connections in the various devices 100 in the array 50, inadvertently skip some of the connections altogether in the array, or to inadvertently create issues in the power line circuitry upstream from the array 50. Especially as the number of devices 100 in the array increases, and when access to the devices 100 may be limited in the enclosure 54, manually going through the connections one-by-one as conventionally has been done can be time consuming and difficult to complete. Even for highly trained technicians, troubleshooting a large array 50 of circuit protection devices 100 may be a challenging task.

Such challenges are perhaps compounded when the fusible circuit protection devices 100 are themselves switchable devices. The operating state of the switches in the devices 100 may present further ambiguity as to whether a problem exists and what corrective action is necessary. An inadvertently opened switch may appear to be a problem with a fuse, and so may an incompletely closed switch. Inadvertent opening of a switch, or incomplete closing of a switch may also appear to be a problem with the line side connection. Likewise, one may rather easily, and incorrectly, believe that an open fuse condition exists when the switch is inadvertently opened or not completely closed. The switches of such devices may be opened manually or automatically in a generally unpredictable manner, and switchable devices are known that can open a circuit path in the device in anticipation of an opening of the fuse. Such devices may create even greater ambiguity in diagnosing problems and taking corrective actions to operate the power system efficiently while still protecting the desired loads.

As a result of the issues discussed above, it is sometimes a trial and error exercise to identify and resolve issues that may be present in the array 50 at any given point in time. In the example shown, a technician may possibly check all twenty four power line connections to the devices 100 only to find that there was no problem with any of those connections, or may replace all the fuses in the device 100 only to find that there is no problem with the fuse. It is also possible that one may have to check the power line connections more than once before actually locating a problem connection, or may have to check all the fuses more than once before locating an opened fuse or an improperly installed fuse. While some circuit protection devices include state indicators and other features to help identify open fuse events and the like, they can be rendered entirely ineffective if the root of the problem is that the device is not receiving electrical power or the fuse, because of improper installation, fails to complete the circuit through a device 100. More efficient tools and methods to diagnose and troubleshoot an array of circuit protection devices are desired. Undue delays in restoring electrical power to affected loads is undesirable for a host of reasons.

Figure 2:
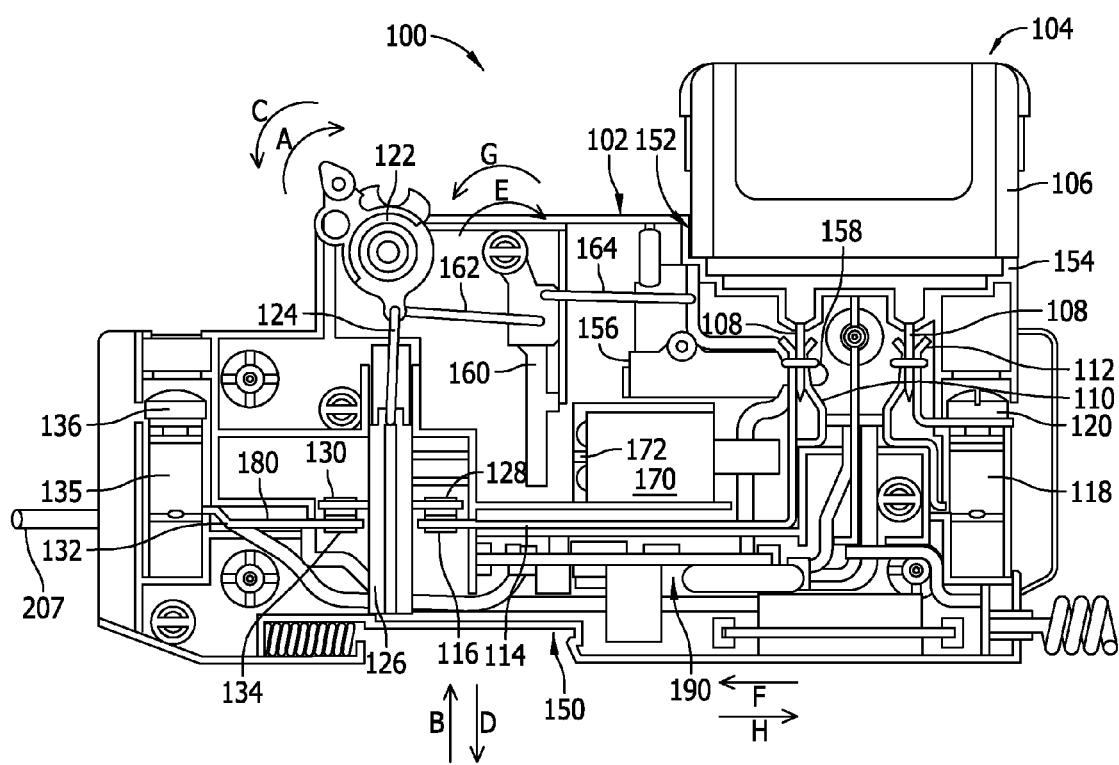
FIG. 2 is a side elevational view of a portion of an exemplary embodiment of a fusible switching disconnect device.

FIG. 2 is a side elevational view of a portion of an exemplary embodiment of a fusible switching disconnect device 100. The disconnect device 100 generally includes a disconnect housing 102 and a finger-safe rectangular fuse module 104 having terminal blades received in pass through openings in the top of the disconnect device 100 such that the fuse module 104 can be plugged-in to the disconnect housing 102 or removed from the disconnect housing 102 by hand by grasping the exposed housing of the rectangular fuse module and either pushing it toward the disconnect housing 102 to engage the terminal blades or pulling it away from the disconnect housing 102 to disengage the terminal blades from connecting terminals in the disconnect housing 102. Such an arrangement has been well received and one of its benefits is that it does not require conventional tools to engage or disengage conventional fasteners to remove or install the fuse module 104.

The device 100 includes a disconnect housing 102 fabricated from an electrically nonconductive or insulative material such as plastic, and the disconnect housing 102 is configured or adapted to receive a retractable rectangular fuse module 104. The disconnect housing 102 and its internal components described below, are sometimes referred to as a base assembly that receives the retractable fuse module 104. The internal components of the disconnect housing 102 include switching elements and actuator components described further below, although it should be understood that the disconnect housing 102 and its internal components represent only one example of a possible disconnect device that may benefit from the exemplary tool and inspection methods described further below.

The fuse module 104 in the exemplary embodiment shown includes a rectangular housing 106 fabricated from an electrically nonconductive or insulative material such as plastic, and conductive terminal elements in the form or terminal blades 108 extending from the housing 106. In the example shown, the terminal blades 108 extend in spaced apart but generally parallel planes extending perpendicular to the plane of the page of FIG. 1. A primary fuse element or fuse assembly is located within the housing 106 and is electrically connected between the terminal blades 108 to provide a current path therebetween. Such fuse modules 104 are known and in one embodiment the rectangular fuse module 104 is a CUBE-Fuse™ power fuse module commercially available from Cooper Bussmann of St. Louis, Mo. The fuse module 104 provides overcurrent protection via the primary fuse element therein that is configured to melt, disintegrate or otherwise fail and permanently open the current path through the fuse element between the terminal blades 108 in response to predetermined current conditions flowing through the fuse element in use. When the fuse element opens in such a manner, the fuse module 104 must be removed and replaced to restore affected circuitry.

A variety of different types of fuse elements, or fuse element assemblies, are known and may be utilized in the fuse module 104 with considerable performance variations in use.

Also, the fuse module 104 may include fuse state indication features, a variety of which are known in the art, to identify the permanent opening of the primary fuse element such that the fuse module 104 can be quickly identified for replacement via a visual change in appearance when viewed from the exterior of the fuse module housing 106. Such fuse state indication features may involve secondary fuse links or elements electrically connected in parallel with the primary fuse element in the fuse module 104.

A conductive line side fuse clip 110 may be situated within the disconnect housing 102 and may receive one of the terminal blades 108 of the fuse module 104. A conductive load side fuse clip 112 may also be situated within the disconnect housing 102 and may receive the other of the fuse terminal blades 108. The line and load side fuse clips 110, 112 may be biased with spring elements and the like to provide some resistance to the plug-in installation and removal of the respective terminal blades, and also to ensure sufficient contact force to ensure electrical connection therebetween when the terminal blades 110, 112 are engaged.

The line side fuse clip 110 may be electrically connected to a first line side terminal 114 provided in the disconnect housing 102, and the first line side terminal 114 may include a stationary switch contact 116. The load side fuse clip 112 may be electrically connected to a load side connection terminal 118. In the example shown, the load side connection terminal 118 is a box lug terminal operable with a screw 120 to clamp or release an end of a connecting wire to establish electrical connection with load side electrical circuitry. Other types of load side connection terminals are known, however, and may be provided in alternative embodiments.

A rotary switch actuator 122 is further provided in the disconnect housing 102, and is mechanically coupled to an actuator link 124 that, in turn, is coupled to a sliding actuator bar 126. The actuator bar 126 carries a pair of switch contacts 128 and 130. In an exemplary embodiment, the switch actuator 122, the link 124 and the actuator bar 128 may be fabricated from nonconductive materials such as plastic. A second conductive line side terminal 132 including a stationary contact 134 is also provided, and a line side connecting terminal 135 is also provided in the disconnect housing 102. In the example shown, the line side connection terminal 135 is a box lug terminal operable with a screw 136 to clamp or release an end of a connecting wire to establish electrical connection with line side electrical circuitry. Other types of line side connection terminals are known, however, and may be provided in alternative embodiments. While in the illustrated embodiment the line side connecting terminal 135 and the load side connecting terminal 118 are of the same type (i.e., both are box lug terminals), it is contemplated that different types of connection terminals could be provided on the line and load sides of the disconnect housing 102 if desired.

Electrical connection of the device 100 to power supply circuitry, sometimes referred to as the line side, may be accomplished in a known manner using the line side connecting terminal 135. Likewise, electrical connection to load side circuitry may be accomplished in a known manner using the load side connecting terminal 118. As mentioned previously, a variety of connecting techniques are known (e.g., spring clamp terminals and the like) and may alternatively be utilized to provide a number of different options to make the electrical connections in the field. The configuration of the connecting terminals 135 and 118 accordingly are exemplary only.

In the position shown in FIG. 1, the disconnect device 100 is shown in the closed position with the switch contacts 130 and 128 mechanically and electrically engaged to the stationary contacts 134 and 116, respectively. As such, when the device 100 is connected to line side circuitry with a first connecting wire via the line side connecting terminal 135, and also when the load side terminal 118 is connected to load side circuitry with a connecting wire via the connecting terminal 118, a circuit path is completed through conductive elements in the disconnect housing 102 and the fuse module 104 when the fuse module 104 is installed and when the primary fuse element therein is in a non-opened, current carrying state.

Specifically, electrical current flow through the device 100 is as follows when the switch contacts 128 and 130 are closed, when the device 100 is connected to line and load side circuitry, and when the fuse module 104 is installed. Electrical current flows from the line side circuitry through the line side connecting wire to and through the line side connecting terminal 135. From the line side connecting terminal 135 current then flows to and through the second line terminal 132 and to the stationary contact 134. From the stationary contact 134 current flows to and through the switch contact 130, and from the switch contact 130 current flows to and through the switch contact 128. From the switch contact 128 current flows to and through the stationary contact 116, and from the stationary contact 116 current flows to and through the first line side terminal 114. From the first line side terminal 114 current flows to and through the line side fuse clip 112, and from the line side fuse clip 112 current flows to and through the first mating fuse terminal blade 108. From the first terminal blade 108 current flows to and through the primary fuse element in the fuse module 104, and from the primary fuse element to and through the second fuse terminal blade 108. From the second terminal blade 108 current flows to and through the load side fuse clip 112, and from the load side fuse clip 112 to and through the load side connecting terminal 118. Finally, from the connecting terminal 118 current flows to the load side circuitry via the wire connected to the terminal 118. As such, a circuit path or current path is established through the device 100 that includes the fuse element of the fuse module 104.

In the example shown, disconnect switching to temporarily open the current path in the device 100 may be accomplished in multiple ways. First, and as shown in FIG. 1, a portion of the switch actuator 122 projects through an upper surface of the disconnect housing 102 and is therefore accessible to be grasped for manual manipulation by a person. Specifically, the switch actuator 122 may be rotated from a closed position as shown in FIG. 1 to an open position in the direction of arrow A, causing the actuator link 124 to move the sliding bar 126 linearly in the direction of arrow B and moving the switch contacts 130 and 128 away from the stationary contacts 134 and 116. Eventually, the switch contacts 130 and 128 become mechanically and electrically disengaged from the stationary contacts 134 and 116 and the circuit path between the first and second line terminals 114 and 132, which includes the primary fusible element of the fuse module 104, may be opened via the separation of the switch contacts 130 and 114 when the fuse terminal blades 108 are received in the line and load side fuse clips 110 and 112.

When the circuit path in the device 100 is opened in such a manner via rotational displacement of the switch actuator 122, the fuse module 104 becomes electrically disconnected from the first line side terminal 132 and the associated line side connecting terminal 135. In other words, an open circuit is established between the line side connecting terminal 135 and the first terminal blade 108 of the fuse module 104 that is received in the line side fuse clip 110. The operation of switch actuator 122 and the displacement of the sliding bar 126 to separate the contacts 130 and 128 from the stationary contacts 134 and 116 may be assisted with bias elements such as the springs. Particularly, the sliding bar 126 may be biased toward the open position wherein the switch contacts 130 and 128 are separated from the contacts 134 and 136 by a predetermined distance. The dual switch contacts 134 and 116 mitigate electrical arcing concerns as the switch contacts 134 and 116 are engaged and disengaged.

Once the switch actuator 122 of the disconnect device 100 is switched open to interrupt the current path in the device 100 and disconnect the fuse module 104, the current path in the device 100 may be closed to once again complete the circuit path through the fuse module 104 by rotating the switch actuator 122 in the opposite direction indicated by arrow C in FIG. 1. As the switch actuator 122 rotates in the direction of arrow C, the actuator link 124 causes the sliding bar 126 to move linearly in the direction of arrow D and bring the switch contacts 130 and 128 toward the stationary contacts 134 and 114 to close the circuit path through the first and second line terminals 114 and 132. As such, by moving the actuator 122 to a desired position, the fuse module 104 and associated load side circuitry may be connected and disconnected from the line side circuitry while the line side circuitry remains "live" in an energized, full power condition. Alternatively stated, by rotating the switch actuator 122 to separate or join the switch contacts, the load side circuitry may be electrically isolated from the line side circuitry, or electrically connected to the line side circuitry on demand. While the switch actuator 122 and associated switching components is desirable in many applications, it is contemplated that the switch actuator 122 and related switching components may in some embodiments be considered optional and may be omitted.

Additionally, the fuse module 104 may be simply plugged into the fuse clips 110, 112 or extracted therefrom to install or remove the fuse module 104 from the disconnect housing 102. The fuse housing 106 projects from the disconnect housing 102 and is open and accessible from an exterior of the disconnect housing 102 so that a person simply can grasp the fuse housing 106 by hand and pull or lift the fuse module 104 in the direction of arrow B to disengage the fuse terminal blades 108 from the line and load side fuse clips 110 and 112 until the fuse module 104 is completely released from the disconnect housing 102. An open circuit is established between the line and load side fuse clips 110 and 112 when the terminal blades 108 of the fuse module 104 are removed as the fuse module 104 is released, and the circuit path between the fuse clips 110 and 112 is completed when the fuse terminal blades 108 are engaged in the fuse clips 110 and 112 when the fuse module 104 is installed. Thus, via insertion and removal of the fuse module 104, the circuit path through the device 100 can be opened or closed apart from the position of the switch contacts as described above.

Of course, the primary fuse element in the fuse module 104 provides still another mode of opening the current path through the device 100 when the fuse module is installed in response to actual current conditions flowing through the fuse element. As noted above, however, if the primary fuse element in the fuse module 104 opens, it does so permanently and the only way to restore the complete current path through the device 100 is to replace the fuse module 104 with another one having a non-opened fuse element. As such, and for discussion purposes, the opening of the fuse element in the fuse module 104 is permanent in the sense that the fuse module 100 cannot be reset to once again complete the current path through the device. Mere removal of the fuse module 104, and also displacement of the switch actuator 122 as described, are in contrast considered to be temporary events and are resettable to easily complete the current path and restore full operation of the affected circuitry by once again installing the fuse module 104 and/or closing the switch contacts.

The fuse module 104, or a replacement fuse module, can be conveniently and safely grasped by hand via the fuse module housing 106 and moved toward the switch housing 102 to engage the fuse terminal blades 108 to the line and load side fuse clips 110 and 112. The fuse terminal blades 108 are extendable through openings in the disconnect housing 102 to connect the fuse terminal blades 108 to the fuse clips 110 and 112. To remove the fuse module 104, the fuse module housing 106 can be grasped by hand and pulled from the disconnect housing 102 until the fuse module is completely released. As such, the fuse module 104 having the terminal blades 108 may be rather simply and easily plugged into the disconnect housing 102 and the fuse clips 110, 112, or unplugged as desired.

Such plug-in connection and removal of the fuse module 104 advantageously facilitates quick and convenient installation and removal of the fuse module 104 without requiring separately supplied fuse carrier elements common to some conventional fusible disconnect devices. Further plug-in connection and removal of the fuse module 104 does not require conventional tools (e.g., screwdrivers and wrenches) and associated fasteners (e.g., screws, nuts and bolts) common to other known fusible disconnect devices. Also, the fuse terminal blades 108 extend through and outwardly project from a common side of the fuse module body 106, and in the example shown the terminal blades 108 each extend outwardly from a lower side of the fuse housing 106 that faces the disconnect housing 102 as the fuse module 104 is mated to the disconnect housing 102.

In the exemplary embodiment shown, the fuse terminal blades 108 extending from the fuse module body 106 are generally aligned with one another and extend in respective spaced-apart parallel planes. It is recognized, however, that the terminal blades 108 of the module 106 in various other embodiments may be staggered or offset from one another, need not extend in parallel planes, and can be differently dimensioned or shaped. The shape, dimension, and relative orientation of the terminal blades 108, and the receiving fuse clips 110 and 112 in the disconnect housing 102 may serve as fuse rejection features that only allow compatible fuses to be used with the disconnect housing 102. In any event, because the terminal blades 108 project away from the lower side of the fuse housing 106, a person's hand when handling the fuse module housing 106 for plug in installation (or removal) is physically isolated from the terminal blades 108 and the conductive line and load side fuse clips 110 and 112 that receive the terminal blades 108 as mechanical and electrical connections therebetween are made and broken. The fuse module 104 is therefore touch safe (i.e., may be safely handled by hand to install and remove the fuse module 104 without risk of electrical shock).

The disconnect device 100 is rather compact and occupies a reduced amount of space in an electrical power distribution system including the line side circuitry and the load side circuitry than other known fusible disconnect devices and arrangements providing similar effect. In the embodiment illustrated in FIG. 1 the disconnect housing 102 is provided with a DIN rail slot 150 that may be used to securely mount the disconnect housing 102 in place with snap-on installation to a DIN rail by hand and without tools. The DIN rail may be located in a cabinet or supported by other structure, and because of the smaller size of the device 100, a greater number of devices 100 may be mounted to the DIN rail in comparison to conventional fusible disconnect devices.

In another embodiment, the device 100 may be configured for panel mounting by replacing the line side terminal 135, for example, with a panel mounting clip. When so provided, the device 100 can easily occupy less space in a fusible panelboard assembly, for example, than conventional in-line fuse and circuit breaker combinations. In particular, CUBEFuse™ power fuse modules occupy a smaller area, sometimes referred to as a footprint, in the panel assembly than non-rectangular fuses having comparable ratings and interruption capabilities. Reductions in the size of panelboards are therefore possible, with increased interruption capabilities.

In ordinary use of the exemplary device 100 as shown, the circuit path or current path through the device 100 is preferably connected and disconnected at the switch contacts 134, 130, 128, 116 rather than at the fuse clips 110 and 112. By doing so, electrical arcing that may occur when connecting/disconnecting the circuit path may be contained at a location away from the fuse clips 110 and 112 to provide additional safety for persons installing, removing, or replacing fuses. By opening the switch contacts with the switch actuator 122 before installing or removing the fuse module 104, any risk posed by electrical arcing or energized conductors at the fuse and disconnect housing interface is eliminated. The disconnect device 100 is accordingly believed to be safer to use than many known fused disconnect switches.

The disconnect switching device 100 includes still further features, however, that improve the safety of the device 100 in the event that a person attempts to remove the fuse module 104 without first operating the actuator 122 to disconnect the circuit through the fuse module 104, and also to ensure that the fuse module 104 is compatible with the remainder of the device 100. That is, features are provided to ensure that the rating of the fuse module 104 is compatible with the rating of the conductive components in the disconnect housing 102.

As shown in FIG. 1, the disconnect housing 102 in one example includes an open ended receptacle or cavity 152 on an upper edge thereof that accepts a portion of the fuse housing 106 when the fuse module 104 is installed with the fuse terminal blades 108 engaged to the fuse clips 110, 112. The receptacle 152 is shallow in the embodiment depicted, such that a relatively small portion of the fuse housing 106 is received when the terminal blades 108 are plugged into the disconnect housing 102. A remainder of the fuse housing 106, however, generally projects outwardly from the disconnect housing 102 allowing the fuse module housing 106 to be easily accessed and grasped with a user's hand and facilitating a finger safe handling of the fuse module 104 for installation and removal without requiring conventional tools. It is understood, however, that in other embodiments the fuse housing 106 need not project as greatly from the switch housing receptacle when installed as in the embodiment depicted, and indeed could even be substantially entirely contained within the switch housing 102 if desired.

In the exemplary embodiment shown in FIG. 1, the fuse housing 106 includes a recessed guide rim 154 having a slightly smaller outer perimeter than a remainder of the fuse housing 106, and the guide rim 154 is seated in the switch housing receptacle 152 when the fuse module 104 is installed. It is understood, however, that the guide rim 154 may be considered entirely optional in another embodiment and need not be provided. The guide rim 154 may in whole or in part serve as a fuse rejection feature that would prevent someone from installing a fuse module 104 having a rating that is incompatible with the conductive components in the disconnect housing 102. Fuse rejection features could further be provided by modifying the terminal blades 108 in shape, orientation, or relative position to ensure that a fuse module having an incompatible rating cannot be installed.

In contemplated embodiments, the base of the device 100 (i.e., the disconnect housing 102 and the conductive components therein) has a rating that is ½ of the rating of the fuse module 104. Thus, for example, a base having a current rating of 20 A may preferably be used with a fuse module 104 having a rating of 40 A. Ideally, however, fuse rejection features such as those described above would prevent a fuse module of a higher rating, such as 60 A, from being installed in the base. The fuse rejection features in the disconnect housing 102 and/or the fuse module 104 can be strategically coordinated to allow a fuse of a lower rating (e.g., a fuse module having a current rating of 20 A) to be installed, but to reject fuses having higher current ratings (e.g., 60 A and above in the example being discussed). It can therefore be practically ensured that problematic combinations of fuse modules and bases will not occur. While exemplary ratings are discussed above, they are provided for the sake of illustration rather than limitation. A variety of fuse ratings and base ratings are possible, and the base rating and the fuse module rating may vary in different embodiments and in some embodiments the base rating and the fuse module rating may be the same.

As a further enhancement, the disconnect housing 102 includes an interlock element 156 that frustrates any effort to remove the fuse module 104 while the circuit path through the first and second line terminals 132 and 114 via the switch contacts 134, 130, 128, 116 is closed. The exemplary interlock element 156 shown includes an interlock shaft 158 at a leading edge thereof, and in the locked position shown in FIG. 1 the interlock shaft 158 extends through a hole in the first fuse terminal blade 108 that is received in the line side fuse clip 110. Thus, as long as the projecting interlock shaft 158 is extended through the opening in the terminal blade 108, the fuse module 104 cannot be pulled from the fuse clip 110 if a person attempts to pull or lift the fuse module housing 106 in the direction of arrow B. As a result, and because of the interlock element 156, the fuse terminal blades 108 cannot be removed from the fuse clips 110 and 112 while the switch contacts 128, 130 are closed and potential electrical arcing at the interface of the fuse clips 110 and 112 and the fuse terminal blades 108 is avoided. Such an interlock element 156 is believed to be beneficial for the reasons stated but could be considered optional in certain embodiments and need not be utilized.

The interlock element 156 is coordinated with the switch actuator 122 so that the interlock element 156 is moved to an unlocked position wherein the first fuse terminal blade 108 is released for removal from the fuse clip 110 as the switch actuator 122 is manipulated to open the device 100. More specifically, a pivotally mounted actuator arm 160 is provided in the disconnect housing 102 at a distance from the switch actuator 122, and a first generally linear mechanical link 162 interconnects the switch actuator 122 with the arm 160. The pivot points of the switch actuator 122 and the arm 160 are nearly aligned in the example shown in FIG. 1, and as the switch actuator 122 is rotated in the direction of arrow A, the link 162 carried on the switch actuator 122 simultaneously rotates and causes the arm 160 to rotate similarly in the direction of arrow E. As such, the switch actuator 122 and the arm 160 are rotated in the same rotational direction at approximately the same rate.

A second generally linear mechanical link 164 is also provided that interconnects the pivot arm 160 and a portion of the interlock element 156. As the arm 160 is rotated in the direction of arrow E, the link 164 is simultaneously displaced and pulls the interlock element 156 in the direction of arrow F, causing the projecting shaft 158 to become disengaged from the first terminal blade 108 and unlocking the interlock element 156. When so unlocked, the fuse module 104 can then be freely removed from the fuse clips 110 and 112 by lifting on the fuse module housing 106 in the direction of arrow B. The fuse module 104, or perhaps a replacement fuse module 104, can accordingly be freely installed by plugging the terminal blades 108 into the respective fuse clips 110 and 112.

As the switch actuator 122 is moved back in the direction of arrow C to close the disconnect device 100, the first link 162 causes the pivot arm 160 to rotate in the direction of arrow G, causing the second link 164 to push the interlock element 156 in the direction of arrow H until the projecting shaft 158 of the interlock element 156 again passes through the opening of the first terminal blade 108 and assumes a locked position with the first terminal blade 108. As such, and because of the arrangement of the arm 160 and the links 162 and 164, the interlock element 156 is slidably movable within the disconnect housing 102 between locked and unlocked positions. This slidable movement of the interlock element 156 occurs in a substantially linear and axial direction within the disconnect housing 102 in the directions of arrow F and H in FIG. 1.

In the example shown, the axial sliding movement of the interlock element 156 is generally perpendicular to the axial sliding movement of the actuator bar 116 that carries the switchable contacts 128 and 130. In the plane of FIG. 1, the movement of the interlock element 156 occurs along a substantially horizontal axis, while the movement of the sliding bar 126 occurs along a substantially vertical axis. The vertical and horizontal actuation of the sliding bar 126 and the interlock element 156, respectively, contributes to the compact size of the resultant device 100, although it is contemplated that other arrangements are possible and could be utilized to mechanically move and coordinate positions of the switch actuator 122, the switch sliding bar 126 and the interlock element 156. Also, the interlock element 156 may be biased to assist in moving the interlock element to the locked or unlocked position as desired, as well as to resist movement of the switch actuator 122, the sliding bar 126 and the interlock element 156 from one position to another. For example, by biasing the switch actuator 122 to the opened position to separate the switch contacts, either directly or indirectly via bias elements acting upon the sliding bar 126 or the interlock element 156, inadvertent closure of the switch actuator 122 to close the switch contacts and complete the current path may be largely, if not entirely frustrated, because once the switch contacts are opened a person must apply a sufficient force to overcome the bias force and move the switch actuator 122 back to the closed position shown in FIG. 1 to reset the device 100 and again complete the circuit path. If sufficient bias force is present, it can be practically ensured that the switch actuator 122 will not be moved to close the switch via accidental or inadvertent touching of the switch actuator 122.

The interlock element 156 may be fabricated from a nonconductive material such as plastic according to known techniques, and may be formed into various shapes, including but not limited to the shape depicted in FIG. 1. Rails and the like may be formed in the disconnect housing 102 to facilitate the sliding movement of the interlock element 156 between the locked and unlocked positions.

The pivot arm 160 is further coordinated with a tripping element 170 for automatic operation of the device 100 to open the switch contacts 128, 130. That is, the pivot arm 160, in combination a tripping element actuator described below, and also in combination with the linkage 124, 162, and 164 define a tripping mechanism to force the switch contacts 128, 130 to open independently from the action of any person. Operation of the tripping mechanism is fully automatic, as described below, in response to actual circuit conditions, as opposed to the manual operation of the switch actuator 122 described above. Further, the tripping mechanism is multifunctional as described below to not only open the switch contacts, but to also to displace the switch actuator 122 and the interlock element 156 to their opened and unlocked positions, respectively. The pivot arm 160 and associated linkage may be fabricated from relatively lightweight nonconductive materials such as plastic.

In the example shown in FIG. 1, the tripping element actuator 160 is an electromagnetic coil such as a solenoid having a cylinder or pin 172, sometimes referred to as a plunger, that is extendable or retractable in the direction of arrow F and H along an axis of the coil. The coil when energized generates a magnetic field that causes the cylinder or pin 172 to be displaced. The direction of the displacement depends on the orientation of the magnetic field generated so as to push or pull the plunger cylinder or pin 172 along the axis of the coil. The plunger cylinder or pin 172 may assume various shapes (e.g., may be rounded, rectangular or have other geometric shape in outer profile) and may be dimensioned to perform as hereinafter described.

In the example shown in FIG. 1, when the plunger cylinder or pin 172 is extended in the direction of arrow F, it mechanically contacts a portion of the pivot arm 160 and causes rotation thereof in the direction of arrow E. As the pivot arm 160 rotates, the link 162 is simultaneously moved and causes the switch actuator 122 to rotate in the direction of arrow A, which in turn pulls the link 124 and moves the sliding bar 126 to open the switch contacts 128, 130. Likewise, rotation of the pivot arm 160 in the direction of arrow E simultaneously causes the link 164 to move the interlock element 156 in the direction of arrow F to the unlocked position.

It is therefore seen that a single pivot arm 160 and the linkage 162 and 164 mechanically couples the switch actuator 122 and the interlock element 156 during normal operation of the device, and also mechanically couples the switch actuator 122 and the interlock element 156 to the tripping element 170 for automatic operation of the device. In the exemplary embodiment shown, an end of the link 124 connecting the switch actuator 122 and the sliding bar 126 that carries the switch contacts 128, 130 is coupled to the switch actuator 122 at approximately a common location as the end of the link 162, thereby ensuring that when the tripping element 170 operates to pivot the arm 160, the link 162 provides a dynamic force to the switch actuator 122 and the link 124 to ensure an efficient separation of the contacts 128 and 130 with a reduced amount of mechanical force than may otherwise be necessary. The tripping element actuator 170 engages the pivot arm 160 at a good distance from the pivot point of the arm 160 when mounted, and the resultant mechanical leverage provides sufficient mechanical force to overcome the static equilibrium of the mechanism when the switch contacts are in the opened or closed position. A compact and economical, yet highly effective tripping mechanism is therefore provided. Once the tripping mechanism operates, it may be quickly and easily reset by moving the switch actuator 122 back to the closed position that closes the switch contacts.

Suitable solenoids are commercially available for use as the tripping actuator element 170. Exemplary solenoids include LEDEX® Box Frame Solenoid Size B17M of Johnson Electric Group (www.ledex.com) and ZHO-0520L/S Open Frame Solenoids of Zohnen Electric Appliances (www.zonhen.com). In different embodiments, the solenoid 170 may be configured to push the arm 160 and cause it to rotate, or to pull the contact arm 160 and cause it to rotate. That is, the tripping mechanism can be operated to cause the switch contacts to open with a pushing action on the pivot arm 160 as described above, or with a pulling action on the pivot arm 160. Likewise, the solenoid could operate on elements other than the pivot arm 160 if desired, and more than one solenoid could be provided to achieve different effects.

In still other embodiments, it is contemplated that actuator elements other than a solenoid may suitably serve as a tripping element actuator to achieve similar effects with the same or different mechanical linkage to provide comparable tripping mechanisms with similar benefits to varying degrees. Further, while simultaneous actuation of the components described is beneficial, simultaneous activation of the interlock element 156 and the sliding bar 126 carrying the switch contacts 128, 130 may be considered optional in some embodiments and these components could accordingly be independently actuated and separately operable if desired. Different types of actuator could be provided for different elements.

Moreover, in the embodiment shown the trip mechanism is entirely contained within the disconnect housing 102 while still providing a relatively small package size. It is recognized, however, that in other embodiments the tripping mechanism may in whole or in part reside outside the disconnect housing 102, such as in separately provided modules that may be joined to the disconnect housing 102. As such, in some embodiments, the trip mechanism could be, at least in part, considered an optional add-on feature provided in a module to be used with the disconnect housing 102. Specifically, the trip element actuator and linkage in a separately provided module may be mechanically linked to the switch actuator 122, the pivot arm 160 and/or the sliding bar 126 of the disconnect housing 102 to provide comparable functionality to that described above, albeit at greater cost and with a larger overall package size.

The tripping element 170 and associated mechanism may further be coordinated with a detection element and control circuitry to automatically move the switch contacts 128, 130 to the opened position when predetermined electrical conditions occur. In one exemplary embodiment, the second line terminal 132 is provided with an in-line detection element 180 that is monitored by control circuitry 190. As such, actual electrical conditions can be detected and monitored in real time and the tripping element 170 can be intelligently operated to open the circuit path in a proactive manner independent of operation of the fuse module 104 itself and/or any manual displacement of the switch actuator 122. That is, by sensing, detecting and monitoring electrical conditions in the line terminal 132 with the detection element 180, the switch contacts 128, 130 can be automatically opened with the tripping element 170 in response to predetermined electrical conditions that are potentially problematic for either of the fuse module 104 or the base assembly (i.e., the disconnect housing 102 and its components).

Figure 3:
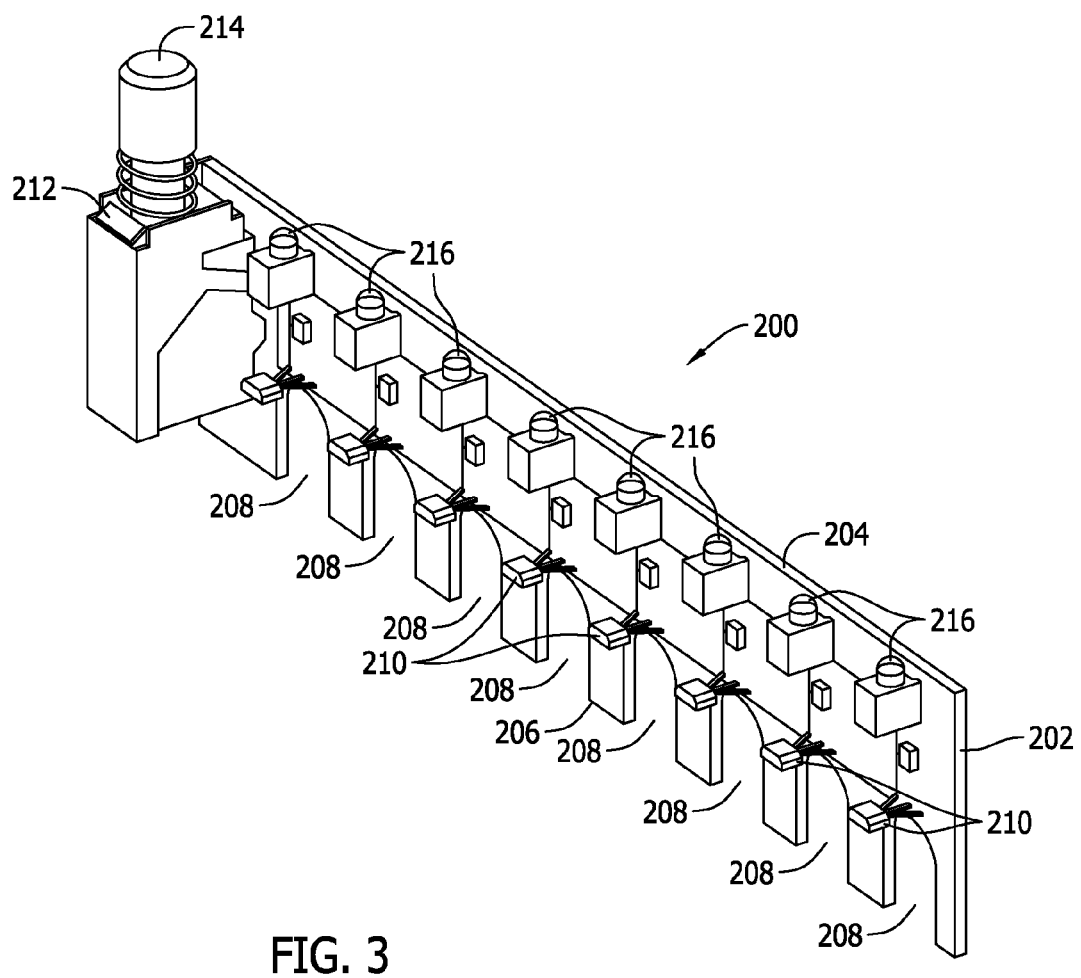
FIG. 3 is a perspective of the power line indicator accessory shown for the array of circuit protection devices shown in FIG. 1.
Figure 4:
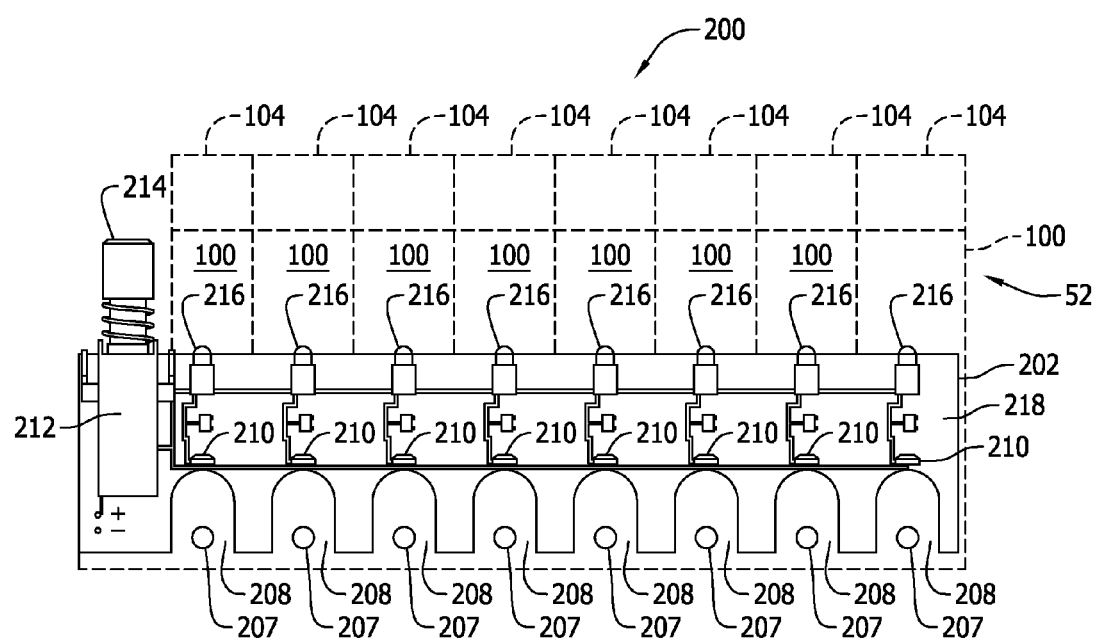
FIG. 4 is an elevational view of a first side of the accessory shown in FIG. 3.
Figure 5:
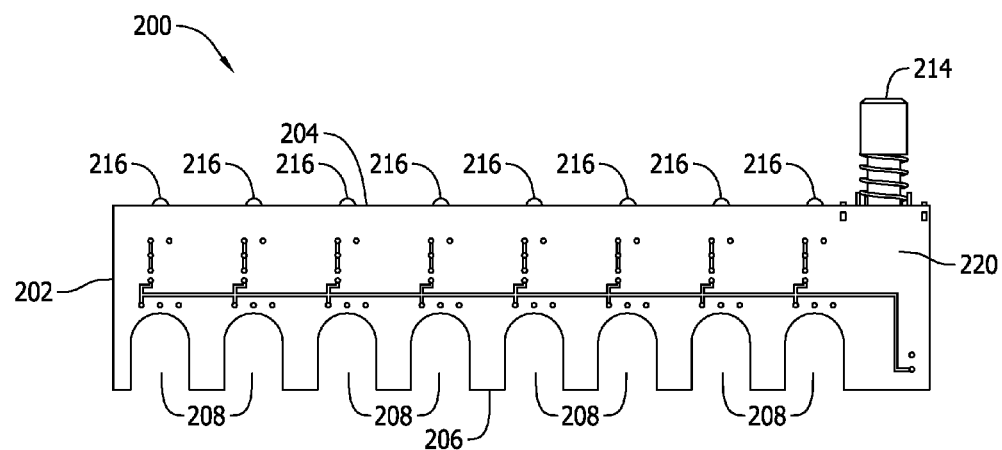
FIG. 5 is an elevational view of a second side of the accessory shown in FIG. 3.

In particular, the control circuitry 190 may open the switch contacts in response to conditions that may otherwise, if allowed to continue, cause the primary fuse element in the fuse module 104 to permanently open and interrupt the electrical circuit path between the fuse terminals 108. Such monitoring and control may effectively prevent the fuse module 104 from opening altogether in certain conditions, and accordingly save it from having to be replaced, as well as providing notification to electrical system operators of potential problems in the electrical power distribution system. Beneficially, if permanent opening of the fuse is avoided via proactive management of the tripping mechanism, the device 100 becomes, for practical purposes, a generally resettable device that may in many instances avoid any need to locate a replacement fuse module, which may or may not be readily available if needed, and allow a much quicker restoration of the circuitry than may otherwise be possible if the fuse module 104 has to be replaced. It is recognized, however, that if certain circuit conditions were to occur, permanent opening of the fuse 104 may be unavoidable FIG. 3-5 illustrate an exemplary power line indicator accessory 200 that may be utilized with the fusible circuit protection devices 100 such as those described above to efficiently monitor the connections and troubleshoot an array of devices such as the array 50 shown in FIG. 1.

The accessory 200 includes a generally elongated body 202 having an elongated upper edge 204 and a lower edge 206 extending opposite the upper edge. The lower edge 206 includes a plurality of openings or recesses 208 that may be positioned over the power line wires, cables or conductors 207 (FIG. 4) that extend into the connection ports of the device 100 (FIGS. 1 and 2) to establish line side connection to the terminal 135 in each device 100 as described above. The recesses 208 are sized and spaced such that the body 200 can span a plurality of conductors 207 alongside the devices 100, with each of the recesses 208 accommodating one of the conductors 207 as shown in FIG. 4.

Sensor elements 210 are situated atop the openings or recesses 208 formed on the lower edge 206, and in an exemplary embodiment the sensor elements 210 are Hall Effect sensors that can detect a presence of electrical current in a wire, conductor or cable that is passed through the respective openings 206. Other types of sensors may, however, be utilized to monitor and detect the operating status of the wires, cables or conductors 207 completing electrical connection to the devices 100.

In the example shown, there are eight openings or recesses 208 and eight sensor elements 210 provided, with each of the sensors independently operable to detect current in one of the wires, cables or conductors 207 connecting to the fusible circuit protection device 100. The operating state of the conductors 207 can therefore be readily ascertained at any time.

The accessory 200 also includes a battery 212, an actuator in the form of a push button 214, and a plurality of indicators 216 in the form of light emitting diodes. The battery 212 in the example shown is carried on one end of the body 202 and the push button 214 extends above the battery and projects upwardly from and beyond the upper edge 204 of the body. The indicators 216 are located above the recesses 208 and are generally arranged along the upper edge 204 of the body. The indicators 216 and the sensor elements 210 are located in pairs associated with each respective opening 208 in the body 102. The battery 212 may be a low cost and readily available 9V battery. Of course, other types of batteries and other types of power supplies are also possible.

Circuit traces interconnect the battery 212, the sensor elements 210 and the indicators 216 on the body 202. When the push button 214 is depressed, electrical connection between the battery 212 and the circuitry on the body 202 is established, and the battery 212 simultaneously powers all of the sensor elements 210 to detect whether current is flowing in the wires, cables or conductors 207 passing through the recesses 208. In one example, the indicators are lit if the sensor elements 210 detect current in their respective conductors 207. If one or more of the sensor elements 210 does not detect current, however, the indicator will not be lit. As such, by simply slipping the accessory 200 over the conductors 207 establishing the power line connections to the fusible circuit protection devices 100, one can easily see with a simple press of the pushbutton 214 which of the devices 100 is receiving electrical current (and hence power) and which ones are not by observing the indicators 216. Of course, in another embodiment the indication scheme could effectively be reversed, such that the indicators 216 are lit only when the sensors 210 fail to detect electrical current in the respective conductors 207.

When the push button 214 is released, the battery 212 is electrically disconnected from the circuitry on the body 202 and no indications are provided. Battery life is accordingly preserved by providing indication only on demand. It is contemplated that the battery could be connected for predetermined period of time when the push button 214 is depressed such that the user need not continually press the button 214 to see the indications. Also, while one type of actuator in the form of a pushbutton is shown, other types of actuators may be utilized, including but not limited to selectable switches and the like to turn the accessory on and off.

In the example shown, eight recesses 208, eight sensor elements 210 and eight indicators 216 are provided such that the accessory 210 can be conveniently utilized to simultaneously check all eight fusible protection devices 100 in the rows 52 (FIG. 1) of the array 50. Rather than having to individually check all twenty four of the power line connections to the respective devices 100 in the array 50, the accessory 200 could simply used three times, once on each row 52, to confirm the presence or absence of electrical power to the devices 100 in each row. Considerable time savings in troubleshooting the array 50 is accordingly facilitated.

While described so far in the context of the load side conductors 207 to the devices 100, the accessory 200 could likewise be used on the load side connections to the devices 100 in the array to quickly ascertain whether current is being output from the circuit protection devices. Like the load side connections, this can be quickly accomplished by using the accessory three times, once in each row 52 to monitor and detect a presence or absence of current in the load side wires, cables or conductors. This can easily confirm any indications provided on the devices 100 concerning the state of the fuses 104, as well as detect possibly improperly installed fuses or malfunctioning fuses or indicators on the devices 100.

Thus, by virtue of the accessory 200, a technician can quickly assess all the line side and load side connections in the array via six easy passes with the accessory, as opposed to having to manually check all forty eight of the line and load side connections individually as otherwise may be required. The on board battery 212 provides portability to the accessory to quickly check the connections without requiring line side power from the electrical power system being protected. These advantages are even more pronounced as the number of rows 52 in the array 50 (FIG. 1) of devices 100 increases, or when multiple enclosures 54 housing different arrays 50 are utilized in combination.

It is contemplated that in other embodiments the accessory 200 may be configured to simultaneously monitor more or less than eight conductors 207 by providing different numbers of sensor elements 210 and indicators 216.

In the example shown, the body 200 of the accessory is generally flat and planar, and may be fabricated from known circuit board materials. The body may have a first major surface 218 (FIG. 4) and a second major surface 220 (FIG. 5), and a thin edge profile therebetween. As seen shown in FIGS. 4 and 5, the sensors 210, the battery 212, and the indicators 216 all extend on the major surface 218. The opposing surface 220 is flat and free of obstructions such that it can be located adjacent the side edges of the fusible circuit protection devices 100 in use. The flat, planar construction of the body 202 facilitates ease of use in an edgewise manner adjacent the devices 100 even when space in the enclosure 54 (FIG. 1) is limited, or when the rows 52 in the array 50 are relatively close together.

Figure 6:
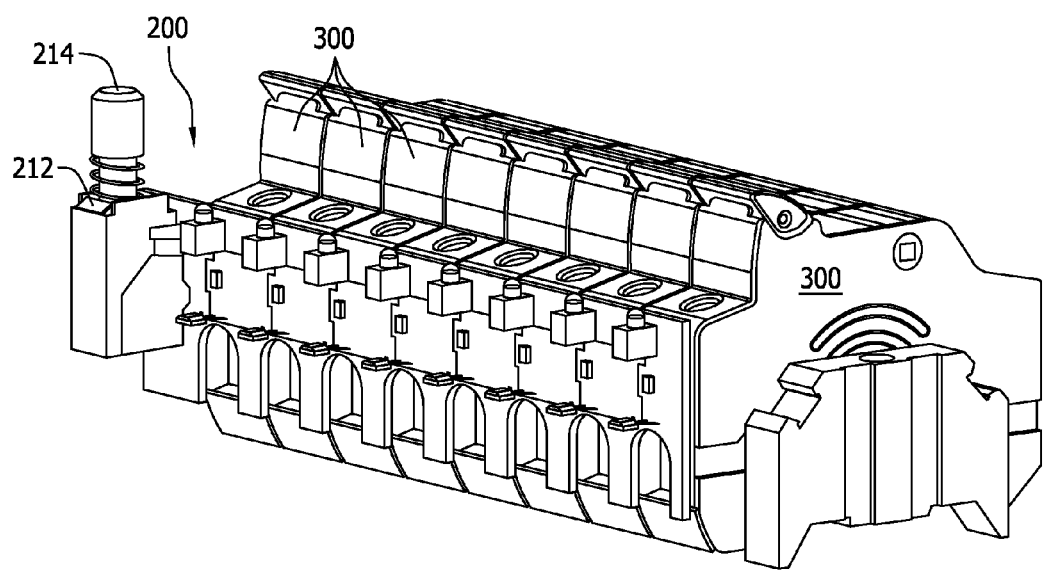
FIG. 6 illustrates the power line indicator being utilized with alternative fusible circuit protection devices in an array.

FIG. 6 illustrates the power line indicator accessory 200 being utilized with alternative fusible circuit protection devices in the form of modular fuse holders 300 in an array inside a combiner box. The fuse holders 300 are adapted to receive cylindrical cartridge fuses in a conventional manner, and lack the switch capability described in relation to the devices 100. Nonetheless, the fuse holders 300 may provide acceptable protection of the load side circuitry. The accessory 200 is shown alongside the fuse holders 300 with the recesses 208 exposing the connection ports of the fuse holders 300 and the body 202 spanning a plurality of the fuse holders 300 in the row. When wires, cables or conductors (not shown in FIG. 6 but similar to the conductors 207 shown in FIG. 4) are connected to the terminals in the fuse holders 300, the accessory 200 may easily slip over the conductors and used to assess the presence or absence of current in the conductors.

If desired, the accessory 200 could be provided with mating features to couple to a portion of the circuit protection devices 100 or 300. That is, the accessory could be detachably coupled to the fusible circuit protection devices 100 or 300 for temporary use in a self supporting manner. Even further, the accessory features 200 as described could be built-in to one or more of the circuit protection devices 100 or 300.

The advantages of the exemplary concepts disclosed are now believed to have been amply illustrated in relation to the exemplary embodiments disclosed.

An embodiment of a power line status indicator accessory for an array of circuit protection devices has been disclosed. The accessory includes: an elongated body configured to span a plurality of power line conductors connectable to a respective one of the circuit protection devices in the array; a plurality of sensors attached to the elongated body, wherein each of the plurality of sensors corresponds to one of the plurality of conductors and each of the sensors is configured to detect an operating status of the respective conductor; a power supply attached to the elongated body; an actuator associated with the power supply, the actuator configured to electrically connect the power supply to the plurality of sensors when activated; and a plurality of indicators attached to the elongated body, wherein each of the plurality of indicators corresponds to a respective one of the plurality of sensors and is independently operable to indicate the operating status of the respective conductor.

Optionally, the elongated body may define a first elongated edge and plurality of power line connection recesses formed along the first elongated edge. Each of the plurality of sensors may be located proximate one of the power line connection recesses. The elongated body may further define a second elongated edge opposing the first elongated edge, each of the plurality of indicators arranged along the second elongated edge. The plurality of sensors may include Hall Effect sensors configured to detect current in the respective conductors.

The plurality of indicators may include light emitting diodes. The actuator may include a pushbutton. The body may include a first major surface and a second major surface opposing the first major surface, and wherein all of the actuator, the power supply, the sensors, and the indicators are attached to the same one of the first and second major surfaces. The power supply may include a battery, and the battery may include a 9V battery. The accessory is configured to simultaneously indicate the operating state of the conductors.

An embodiment of a circuit protection device array has also been disclosed. The array includes: a plurality of circuit protection devices each having a housing, the housings of the respective devices arranged side-by-side and each housing including at least one terminal for receiving a conductor associated with one of line side and load side circuitry; a plurality of sensors each respectively corresponding to one of the plurality of conductors and each of the sensors configured to detect an operating status of one of the respective conductors; a power supply separate from the line side and load side circuitry; an actuator associated with the power supply, the actuator configured to electrically connect the power supply to the plurality of sensors when activated; and a plurality of indicators, wherein each of the plurality of indicators corresponds to a respective one of the plurality of sensors and is independently operable to indicate the operating status of the respective conductor.

Optionally, the plurality of circuit protection devices may include fusible circuit protection devices, fusible switch disconnect devices, and modular fuse holders. The plurality of circuit protection devices may include a plurality of replaceable fuses inserted at least partly into the respective housings. The plurality of replaceable fuses may include rectangular fuse modules having plug-in terminal blades.

The array may further include an elongated body, the elongated body separately supplied from the housings and having a plurality of recesses each receiving one of the respective conductors for each circuit protection device. Each of the plurality of sensors may be attached to the elongated body and is located proximate one of the power line connection recesses. The elongated body may also define a second elongated edge opposing the first elongated edge, with each of the plurality of indicators arranged along the second elongated edge. The elongated body may also include a first major surface and a second major surface opposing the first major surface, wherein all of the actuator, the power supply, the sensors, and the indicators are attached to the same one of the first and second major surfaces.

The plurality of sensors may include Hall Effect sensors configured to detect current in the respective conductors. The plurality of indicators may include light emitting diodes. The actuator may include a pushbutton. The power supply may include a battery, and the battery may be a 9V battery.

An embodiment of a fusible circuit protection device assembly has also been disclosed. The fusible circuit protection device includes: a plurality of circuit protection devices each having a housing, a circuit path defined in the housing, and a fuse completing the circuit path; the housings of the plurality of circuit protection devices arranged side-by-side in a row; and an indicator spanning the plurality of circuit protection devices and simultaneously determining an operating state of an input power line connection to each of the plurality of circuit protection devices; a plurality of sensors each respectively corresponding to one of the plurality of conductors and each of the sensors configured to detect an operating status of one of the respective conductors; a power supply separate from the line side and load side circuitry; an actuator associated with the power supply, the actuator configured to electrically connect the power supply to the plurality of sensors when activated; and a plurality of indicators, wherein each of the plurality of indicators corresponds to a respective one of the plurality of sensors and is independently operable to indicate the operating status of the respective conductor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power line status indicator accessory for a plurality of power line conductors connected to an array of circuit protection devices, the power line status indicator accessory comprising:
    a portable elongated body;
    a plurality of sensors attached to the portable elongated body, wherein each of the plurality of sensors respectively corresponds to one of the plurality of power line conductors and wherein each of the plurality of sensors is configured to detect an operating status of the respective one of the plurality of power line conductors when the portable elongated body is slipped over and spans the plurality of power line conductors;
    a power supply attached to the portable elongated body;
    an actuator associated with the power supply, the actuator configured to electrically connect the power supply to at least one of the plurality of sensors only when activated;
    a plurality of indicators attached to the portable elongated body, wherein each of the plurality of indicators respectively corresponds to one of the plurality of sensors and is operable to indicate the operating status of the respective power line conductor;
    wherein the portable elongated body comprises a first major surface and a second major surface opposing the first major surface; and
    wherein all of the actuator, the power supply, the plurality of sensors, and the plurality of indicators are attached to the same one of the first and second major surfaces.

2. The power line status indicator accessory of claim 1, wherein the portable elongated body defines a first elongated edge and plurality of power line connection recesses formed along the first elongated edge.

3. The power line status indicator accessory of claim 2, wherein each of the plurality of sensors is located proximate one of the plurality of power line connection recesses.

4. The power line status indicator accessory of claim 2, wherein the portable elongated body further defines a second elongated edge opposing the first elongated edge, each of the plurality of indicators arranged along the second elongated edge.

5. The power line status indicator accessory of claim 1, wherein the plurality of sensors comprise Hall Effect sensors configured to detect current in the respective power line conductors.

6. The power line status indicator accessory of claim 1, wherein the plurality of indicators comprise light emitting diodes.

7. The power line status indicator accessory of claim 1, wherein the actuator comprises a pushbutton.

8. The power line status indicator accessory of claim 1, wherein the power supply comprises a battery.

9. The power line status indicator accessory of claim 8, wherein the battery comprises a 9V battery.

10. The power line indicator accessory of claim 1, wherein the power line status indicator accessory is configured to simultaneously indicate the operating state of the plurality of power line conductors.

11. The power line status indicator of claim 1, wherein the plurality of sensors comprises a plurality of non-contact sensors.

12. The power line status indicator of claim 11, wherein the portable elongated body defines a first edge, and plurality of power line connection recesses are formed in a row along the first edge and in communication with the first edge, wherein the first edge may be slipped over the power line conductors while the power line conductors are connected to external circuitry, and wherein the first edge may be removed from the power line conductors without disturbing the power line conductors or the external circuitry.

13. A circuit protection device array comprising:
a plurality of fusible circuit protection devices each having a housing and a replaceable fuse inserted at least partly into each respective housing, each housing of the respective plurality of fusible circuit protection devices arranged side-by-side and each housing including at least one terminal for receiving a conductor associated with one of line side and load side circuitry; and
a portable indicator accessory comprising:
a plurality of sensors each respectively corresponding to a respective conductor connected to the at least one terminal in each fusible circuit protection device, and each of the plurality of sensors configured to detect an operating status of each respective conductor;
a power supply separate from the line side and load side circuitry;
an actuator associated with the power supply, the actuator configured to electrically connect the power supply to the plurality of sensors only when activated;
an elongated body, the elongated body separately supplied from the housings of the plurality of fusible circuit protection devices, the elongated body having a first elongated edge and a plurality of recesses formed along and in communication with the first edge, each of the recesses receiving a respective conductor of each circuit protection device when the portable indicator accessory is slipped over a plurality of the respective conductors of the plurality of circuit protection devices;
a plurality of indicators, wherein each of the plurality of indicators corresponds to a respective one of the plurality of sensors and is independently operable to indicate the operating status of the respective conductor when the actuator is operated to connect the power supply to the plurality of sensors;
wherein the elongated body comprises a first major surface and a second major surface opposing the first major surface; and
wherein all of the actuator, the power supply, the plurality of sensors, and the plurality of indicators are attached to the same one of the first and second major surfaces.

14. The circuit protection device array of claim 13, wherein the plurality of fusible circuit protection devices comprises fusible switch disconnect devices.

15. The circuit protection device array of claim 13, wherein the plurality of circuit protection devices comprises modular fuse holders.

16. The circuit protection device array of claim 13, wherein the replaceable fuse comprises a rectangular fuse module having plug-in terminal blades.

17. The circuit protection device array of claim 13, wherein each of the plurality of sensors is located proximate one of the recesses.

18. The circuit protection device array of claim 13, wherein the elongated body further includes a second elongated edge opposing the first elongated edge, each of the plurality of indicators arranged along the second elongated edge.

19. The circuit protection device array of claim 13, wherein the plurality of sensors comprise Hall Effect sensors configured to detect current in the respective conductors.

20. The circuit protection device array of claim 13, wherein the plurality of indicators comprise light emitting diodes.

21. The circuit protection device array of claim 13, wherein the actuator comprises a pushbutton.

22. The circuit protection device array of claim 13, wherein the power supply comprises a battery.

23. The circuit protection device array of claim 22, wherein the battery comprises a 9V battery.

24. The circuit protection device array of claim 13, wherein the plurality of sensors comprises a plurality of non-contact sensors.

25. The circuit protection device array of claim 24, wherein the elongated body defines a first edge, and plurality of power line connection recesses are formed in a row along the first edge and in communication with the first edge, wherein the first edge may be slipped over the conductors while the conductors are connected to external circuitry, and wherein the first edge may be removed from the conductors without disturbing the conductors or the external circuitry.

26. A circuit protection device assembly comprising:
a plurality of circuit protection devices each having a housing, a circuit path defined in the housing, and a fuse completing the circuit path between line side and load side circuitry;
the housings of the plurality of circuit protection devices arranged side-by-side in a row and including a power line connection; and
a portable indicator accessory;
comprising:
a plurality of sensors each respectively corresponding to one of the power line connections and each of the plurality of sensors configured to detect an operating status of one of the respective power line connections;
a power supply separate from the line side and load side circuitry;
an actuator associated with the power supply, the actuator configured to electrically connect the power supply to the plurality of sensors when activated; and
a plurality of indicators, wherein each of the plurality of indicators corresponds to a respective one of the plurality of sensors and is operable to indicate the operating status of the respective power line connection,
wherein the power supply, the plurality of sensors and the plurality of indicators are configured to determine an operating state of the power line connection to each of the plurality of circuit protection devices when the portable indicator accessory spans the plurality of power line connections of the circuit protection devices;
wherein the plurality of sensors comprises a plurality of non-contact sensors; and
wherein the portable elongated body defines a first edge, and a plurality of power line connection recesses are formed in a row along the first edge and in communication with the first edge, wherein the first edge may receive the input power line connections while the power line connections are connected to the line and load side circuitry, and wherein the first edge may be removed from the power line connections without disturbing the power line connection and the line and load side circuitry.

27. The circuit protection device assembly of claim 26, wherein the circuit protection devices comprise fusible circuit protection devices.

28. A status indicator accessory for an array of circuit protection devices connectable to a plurality of conductors, the status indicator accessory comprising:
an elongated body;
a plurality of sensors attached to the elongated body, wherein each of the plurality of sensors corresponds to one of the plurality of conductors and each of the plurality of sensors is configured to detect an operating status of the respective conductor when the elongated body spans the plurality of conductors;
a power supply attached to the elongated body;
an actuator associated with the power supply, the actuator configured to electrically connect the power supply to the plurality of sensors when activated; and
a plurality of indicators attached to the elongated body, wherein each of the plurality of indicators corresponds to a respective one of the plurality of sensors and is independently operable to indicate the operating status of one of the conductors;
wherein the elongated body comprises a first major surface and a second major surface opposing the first major surface; and
wherein all of the actuator, the power supply, the plurality of sensors, and the plurality of indicators are attached to the same one of the first and second major surfaces.

29. The status indicator accessory of claim 28, wherein the accessory is movable relative to the conductors without disturbing the conductors.

30. The status indicator accessory of claim 28, wherein the plurality of sensors are non-contact sensors.

31. A circuit protection device array comprising:
a plurality of circuit protection devices each having a housing, the housings of the respective devices arranged side-by-side and each housing including at least one terminal for receiving a conductor associated with one of line side and load side circuitry;
a plurality of sensors each respectively corresponding to one of the plurality of conductors and each of the sensors configured to detect an operating status of one of the respective conductors;
a power supply separate from the line side and load side circuitry;
an actuator associated with the power supply, the actuator configured to electrically connect the power supply to the plurality of sensors when activated;
a plurality of indicators, wherein each of the plurality of indicators corresponds to a respective one of the plurality of sensors and is independently operable to indicate the operating status of the respective conductor;
wherein the plurality of circuit protection devices comprises a plurality of replaceable fuses inserted at least partly into the respective housings; and
an elongated body, the elongated body separately supplied from the housings and having a plurality of recesses arranged to receive one of the respective conductors for each circuit protection device;
wherein the elongated body comprises a first major surface and a second major surface opposing the first major surface; and
wherein all of the actuator, the power supply, the plurality of sensors, and the plurality of indicators are attached to the same one of the first and second major surfaces.

32. The circuit protection device array of claim 31, wherein the plurality of sensors comprises a plurality of non-contact sensors.

33. The circuit protection device array of claim 32, wherein the portable elongated body defines a first edge, and plurality of power line connection recesses are formed in a row along the first edge and in communication with the first edge, wherein the first edge may receive the conductors while the conductors are connected to external circuitry, and wherein the first edge may be removed from the conductors without disturbing the power line conductors or the external circuitry.

34. A power line status indicator for a circuit protection device assembly including a plurality of circuit protection devices each respectively having a housing, wherein the housings of the plurality of circuit protection devices are arranged side-by-side in a row and wherein each of the plurality of circuit protection devices includes an electrical connection to one of line and load side circuitry;
a portable accessory, separately provided from the circuit protection device assembly, configured to simultaneously determine an operating state of the electrical connections to the plurality of circuit protection devices, wherein the portable accessory comprises:
a portable body;
a plurality of sensors coupled to the portable body, each of the plurality of sensors respectively corresponding to the electrical connections corresponding to each of the plurality of circuit protection devices and each of the plurality of sensors configured to detect an operating status of each respective one of the electrical connections;
a power supply coupled to the portable body;
an actuator associated with the power supply and coupled to the portable body, the actuator configured to electrically connect the power supply to the plurality of sensors when activated; and
a plurality of indicators coupled to the portable body, wherein each of the plurality of indicators corresponds to a respective one of the plurality of sensors and is operable to indicate the operating status of the respective electrical connections;
wherein the portable body defines a first edge, and plurality of electrical connection recesses are formed in a row along the first edge and in communication with the first edge, wherein the first edge may be slipped over the electrical connections to each of the plurality of circuit protection devices while the electrical connections are connected to external circuitry, and wherein the first edge may be removed from the electrical connections to each of the plurality of circuit protection devices without disturbing the electrical connections.

35. The power line status indicator of claim 34, in combination with the circuit protection device assembly.

36. The power line status indicator of claim 35, wherein the circuit protection device assembly includes at least one fusible switch disconnect device.

37. The power line status indicator of claim 35, wherein the circuit protection device assembly includes at least one fuse holder.

38. The power line status indicator of claim 34, wherein the plurality of sensors comprises a plurality of non-contact sensors.

39. The power line status indicator of claim 34, wherein the portable body includes a first major surface and a second major surface opposing the first major surface.

40. The power line status indicator of claim 39, wherein all of the actuator, the power supply, the plurality of sensors, and the plurality of indicators are attached to the same one of the first and second major surfaces.

\* \* \* \* \*